(12) United States Patent
Sundholm

(10) Patent No.: US 8,963,056 B2
(45) Date of Patent: Feb. 24, 2015

(54) PLANAR ELECTRODE SYSTEM

(75) Inventor: Göran Sundholm, Tuusula (FI)

(73) Assignee: Elsi Technologies Oy., Vantaa (FI)

( * ) Notice: Subject to any disclaimer, the term of this patent is extended or adjusted under 35 U.S.C. 154(b) by 781 days.

(21) Appl. No.: 13/202,794

(22) PCT Filed: Feb. 17, 2010

(86) PCT No.: PCT/FI2010/050101
§ 371 (c)(1),
(2), (4) Date: Aug. 23, 2011

(87) PCT Pub. No.: WO2010/097504
PCT Pub. Date: Sep. 2, 2010

(65) Prior Publication Data
US 2011/0308854 A1 Dec. 22, 2011

(30) Foreign Application Priority Data
Feb. 24, 2009 (FI) .................. 20095179

(51) Int. Cl.
| H05B 3/06 | (2006.01) |
| H03K 17/955 | (2006.01) |
| F24D 13/02 | (2006.01) |
| H05B 3/03 | (2006.01) |
| H02G 3/00 | (2006.01) |

(52) U.S. Cl.
CPC ............. *H03K 17/955* (2013.01); *F24D 13/02* (2013.01); *H05B 3/03* (2013.01)
USPC .......... 219/542; 219/447.1; 174/70 R; 29/874

(58) Field of Classification Search
USPC .................. 219/542, 447.1, 518, 506, 446.1, 219/448.11, 448.12, 510; 174/70 R; 29/874
See application file for complete search history.

(56) References Cited

U.S. PATENT DOCUMENTS
| 3,721,800 A | 3/1973 | Eisler |
| 6,259,069 B1 | 7/2001 | Schotten et al. |

FOREIGN PATENT DOCUMENTS
| EP | 1 505 854 A1 | 2/2005 |
| EP | 1505854 | * 2/2005 |
| EP | 1 580 487 A1 | 9/2005 |
| JP | 02-114482 A | 4/1990 |
| JP | 02-234379 A | 9/1990 |
| JP | 03-095323 A | 9/1990 |
| WO | WO 2005/020171 A1 | 3/2005 |
| WO | WO 2006/003245 A1 | 1/2006 |
| WO | WO 2008/068387 A1 | 6/2008 |

* cited by examiner

*Primary Examiner* — Shawntina Fuqua
(74) *Attorney, Agent, or Firm* — Birch, Stewart, Kolasch & Birch, LLP

(57) ABSTRACT

Planar electrode system and method of manufacturing same, comprising at least one foil-type, electrically conductive planar electrode, a connection for connecting it to an external operating apparatus/control apparatus, and also at least one substrate layer, protective layer and/or insulation layer arranged on the surface of the planar electrode, which system comprises a foil-type planar electrode construction fitted into a continuous foil construction and comprising a least one foil-type electrode (101, 111), which planar electrode construction is fitted to operate both as a planar sensor, in which case it can be connected via a sensor connection (103) to a sensor control apparatus (SC101), and in electrical heating action, in which case it can be connected via an electrical heating connection (113) to an electrical heating control apparatus (HC111).

17 Claims, 4 Drawing Sheets

PLANAR ELECTRODE SYSTEM

CROSS-REFERENCE TO RELATED APPLICATIONS

Figure 1:
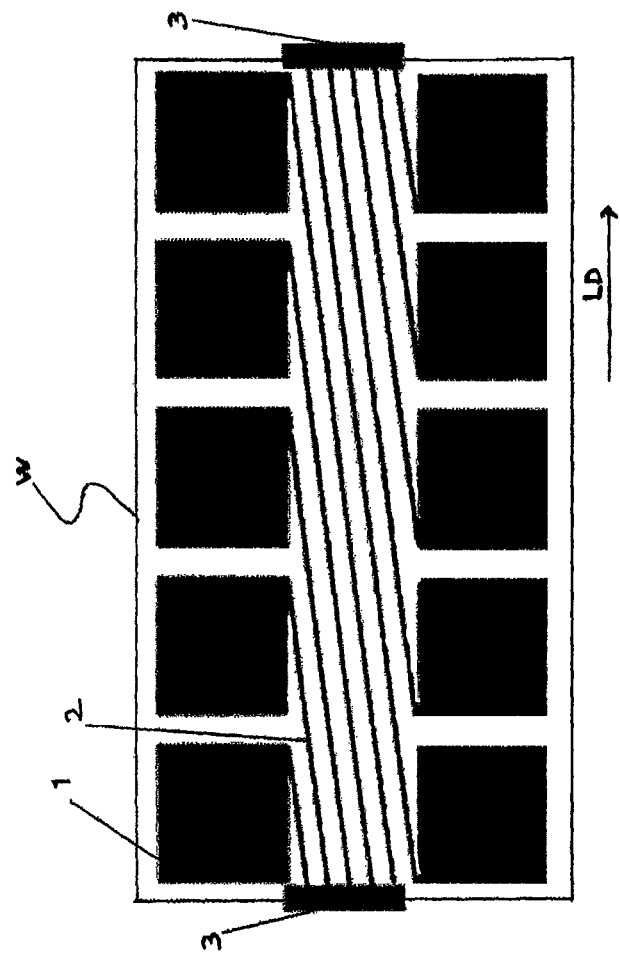

The present application claims priority under 35 USC 119 to PCT Application No. PCT/FI2010/050101 filed Feb. 17, 2010 and Finnish Application No. 20095179 filed Feb. 24, 2009.

FIELD OF INVENTION

The present invention relates to a planar electrode system, which comprises at least one foil-type planar electrode, a connection for connecting it to an external operating apparatus/control apparatus, and also at least one substrate layer, protective layer and/or insulation layer arranged on the surface of the planar electrode. The planar electrode typically comprises a number of juxtaposed electrode areas, which are connected with connection leads to an operating apparatus/control apparatus.

BACKGROUND OF INVENTION

Planar electrode sensors can be used e.g. in floor constructions to electrically monitor the movements and locations of a person, as is described e.g. in publication WO2005/020171A1. This type of sensor can be used e.g. to monitor elderly people in a room, more particularly their movements and their vital functions. Publication WO 2006/0023245 presents one sensor construction for detecting an electrical field, wherein the sensor is in web form and comprises sequential electrically conductive areas. The electrically conductive areas are typically metallic, and they can be formed on a substrate, e.g. as printed layers, laminated layers, etched layers, or films. The metal is typically aluminum or copper, as is disclosed in publication WO2008068387A1. The sensor web according to the publication in question can be manufactured by laminating a metal foil to a release web, after which the electrically conductive areas and the foil-type connection leads in connection with them are stamped out of the metal foil. After that a protective layer is laminated onto the electrically conductive foil-type areas and connection leads, the release web is removed and a backing film is laminated to replace the release film. The manufacturing method in question can be applied also to the types of sensor webs that comprise two or more superimposed layers. In that case the first layer can comprise conductive areas and their leads, and the second layer e.g. RF loops and their leads. The sensor web comprises an output connection for connecting it with a connection cable to the control electronics for supplying measuring voltages and control signals via the connection in question.

In addition, foil-type floor heating systems are known, wherein metallic heating foils, which are disposed under the floor covering, are used for the heating of the floor. The foil is connected with connection cables to a control and current supply apparatus, and the foil is heated by means of electric current. Heating foils generally operate with a mains voltage of 230 V and their output power is typically in the range 50-200 W. One electrical heating foil is disclosed in U.S. Pat. No. 3,721,800, in which an aluminum foil having a thickness of approx. 0.05 mm is used. The foil is insulated on both its surfaces, and it forms a pattern comprising parallel narrow branches, which are connected to each other at their ends with bridges.

A particular drawback in these prior-art solutions is that if it is desired to use floor heating in the rooms in which it is desired to simultaneously monitor the vital functions and movements of the resident of the room by means of a floor sensor, it is necessary to use separate sensor foil and heating foil systems, which is complex and expensive.

SUMMARY OF THE INVENTION

The aim of this invention is to eliminate the drawbacks of prior art and to achieve a new kind of system wherein a heating foil construction and a sensor foil construction are integrated into a single planar electrode construction, in which both systems are controlled with their own control unit, i.e. the sensor foil is connected to a sensor control system whereas the heating foil is connected to a floor heating thermostat or corresponding with which the heating can be controlled.

By means of the invention a solution can be very simply implemented, e.g. in retirement homes or corresponding, wherein the monitoring of a person can be performed and at the same time a room can be heated with a planar electrode construction disposed in the floor.

One preferred embodiment of the invention is such wherein two or More superimposed foils are used, in which case the sensor foil can be disposed to be higher and a heating foil below it, in which case sensor action that is as efficient as possible is achieved in the monitored area and at the same time the area that is heated is maximized.

According to the preferred embodiments of the invention, the construction and control of both systems can also be handled so that they interfere with each other as little as possible. Another significant advantage of this type of system of the invention is the ease of its installation compared to separate sensor and heating systems.

SHORT DESCRIPTION OF THE DRAWINGS

Figure 2:
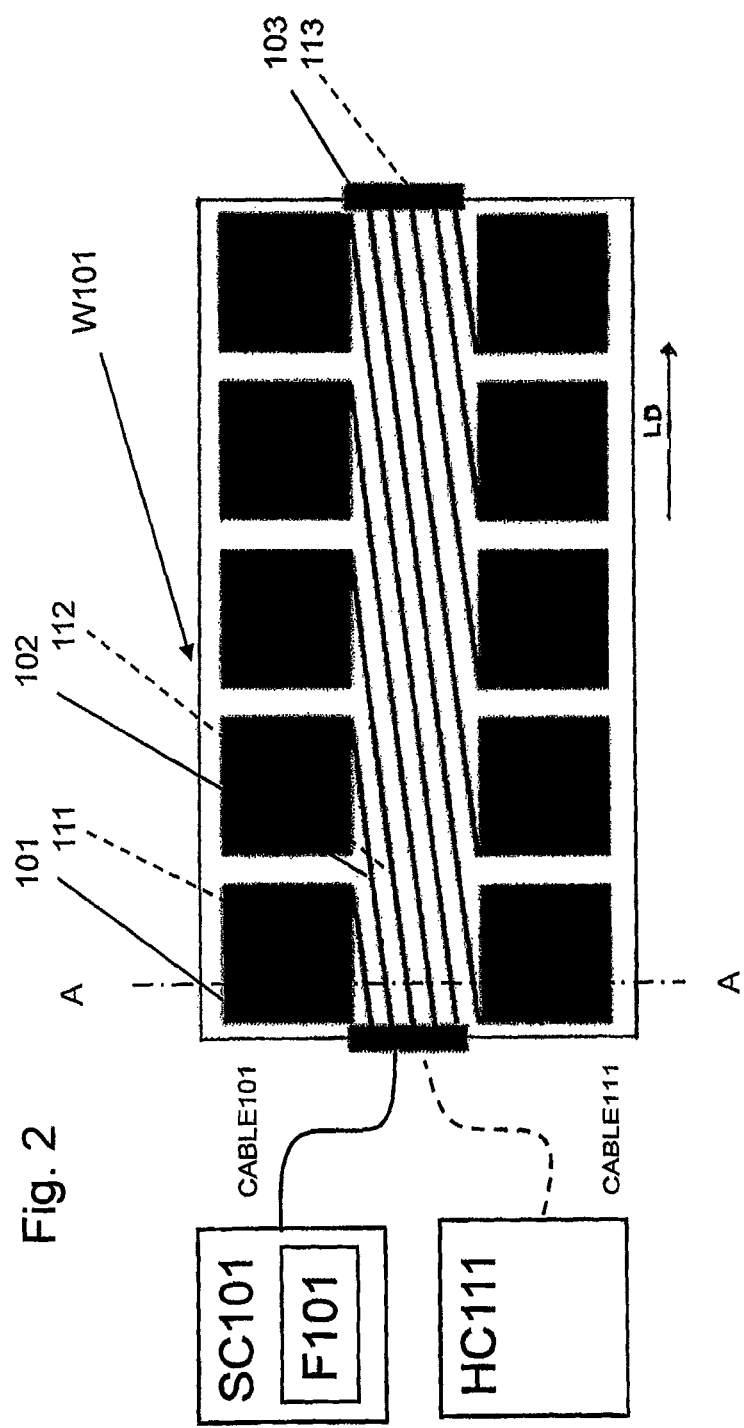
Figure 3:
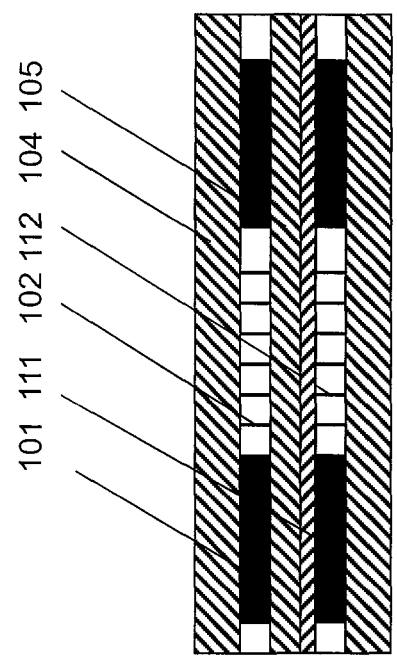

In the following, the invention will be described in more detail by the aid some embodiments with reference to the attached drawings, wherein FIG. 1 presents a prior-art sensor foil construction;

FIGS. 2 and 3 present one system according to the invention, and

Figure 4:
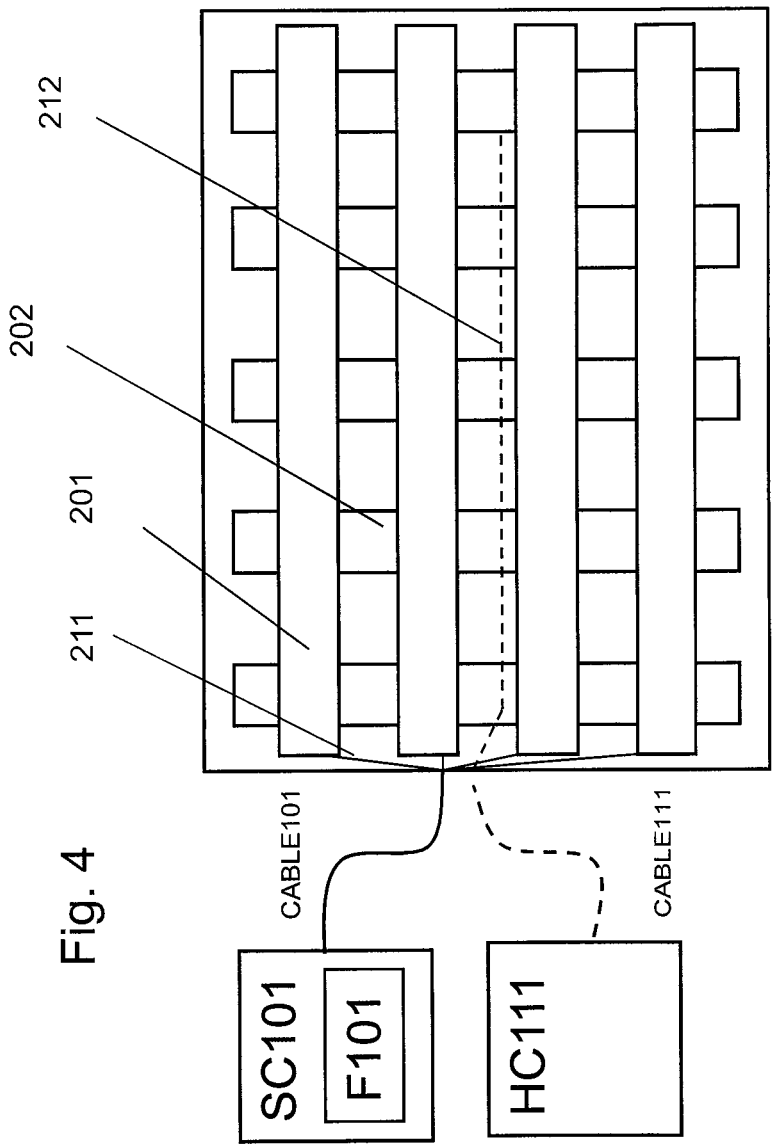

FIG. 4 presents a second system according to the invention.

DETAILED DESCRIPTION OF THE INVENTION

FIG. 1 presents a prior-art planar sensor foil construction according to WO 2008/06837, comprising a sensor web W, which can be used to monitor electrically conductive points, e.g. the movements and position in a room of a person, by means of capacitative detection. The sensor web W comprises sequential and parallel conductive foil areas 1 in two rows as viewed in the longitudinal direction LD. There are also foil-type connection leads 2 between them, which leads connect the electrically conductive areas 1 in the upper row to the output connector 3 on the left, and in the lower row to the output connector 3 on the right. The conductors 2 are side by side, straight and parallel and they form a small angle with respect to the longitudinal direction LD. From these output connections the foil construction is connected with a connection cable to a control unit, with which e.g. a person in a room is thus monitored. Of course, the size of the foil construction is dimensioned according to the area to be monitored, and the webs can e.g. be placed side by side e.g. to cover the floor area of the whole room. The planar electrode sensor comprises a substrate, electrically conductive areas 1, which form sensor elements, which are formed onto the substrate, and conductors 2 to connect the sensor elements to the output connector 3. The electrically conductive areas and conductors can be formed e.g. from etched copper or corresponding metal. A protective layer is on the substrate.

FIGS. 2 and 3 present a planar electrode sensor of the planar electrode system according to the present invention, which comprises a planar electrode construction. It comprises a sensor web W101 corresponding to FIG. 1, which web comprises sequential and parallel conductive foil areas 101 of square shape and in two rows as viewed in the longitudinal direction LD. Likewise as seen in FIG. 2, foil-type connection leads 102 are between the upper row and the lower row, the connection leads connecting the electrically conductive areas in the upper row to the output connector 103 on the left, and in the lower row to the output connector 103 on the right. The conductors are side by side, straight and parallel and they form a small angle with respect to the longitudinal direction LD. From these output connectors the foil construction is connected with connection cables CABLE101 to the control unit SC101 of the planer electrode sensor.

In addition as seen in FIGs. 2 and 3, the sensor construction according to the present invention comprises (presented as a dashed line in FIG. 2) under the sensor foil construction a second similar foil construction insulated from the upper one, which comprises sequential and parallel conductive foil areas 111, roughly of the same size as the first areas, in two rows as viewed in the longitudinal direction LD. Likewise foil-type connection leads 112 are between them, which connection leads connect the electrically conductive areas in the upper row to the output connector 113, on the left and in the lower row to the output connector 113 on the right. The conductors are side by side, straight and parallel and they form a small angle with respect to the longitudinal direction LD. From these output connectors the foil construction is connected with connection cables CABLE111 to the electrical heating thermostat HC111, as seen in FIG. 2.

FIG. 3 illustrates an A-A cross-section the foil construction of FIG. 2, and shows a substrate 105, electrically conductive first areas 101, which form sensor elements, which are formed on top of the substrate 105, and conductors to connect the sensor elements to the output connector.

In addition, FIG. 3 illustrates electrically conductive second areas 111, which form electrical heating elements, which are formed on top of the second substrate 105, and conductors to connect the heating elements to the output connector. A protective layer 104 is on top of the first substrate and an insulating protective layer 104 is between the electrical heating elements and the first substrate.

The foil construction can be manufactured as a web by laminating a metal foil to a release web, after which the electrically conductive areas and the foil-type connection leads in connection with them are stamped out of the metal foil. After that a protective layer is laminated onto the electrically conductive foil-type areas and connection leads, the release web is removed and a backing film is laminated to replace the release film. In the manufacturing method in question, manufacturing occurs in a type of sensor web that comprises two or more superimposed layers, each layer as presented above. The electrically conductive areas can be formed onto a substrate also, e.g. as printed layers, laminated layers, etched layers, or films.

In this type of system the monitoring of a person and the floor heating can be in simultaneous operation. Since electrical heating can cause interference in the operation of a planar electrode sensor, in particular in the output signals, the control unit of the planar electrode sensor comprises a filter, typically a band-pass filter F101, with which interfering signals can be filtered out before conducting the sensor signals to the monitoring control.

The electrical heating and monitoring can also be arranged with a single-layer sensor construction either so that the functions in question have their own foil patterns and connections therefore arranged in the same level and insulated from each other, or so that even the same planar electrode pattern can be used for both purposes, but in this case the control occurs alternately by alternately controlling by means of a switch the control units and operating units intermittently so that they connect in turn to the same planar electrode construction, e.g. at set intervals. Since the heating and detection are in the same foil/pattern, and since the detection goes as a sequence from one foil web to the next, the heating can be removed from that web for a moment, i.e. for example 0.1-1 s, while the detection is measured.

It is obvious to the person skilled in the art that the different embodiments of the invention are not limited solely to the examples described above, but that they may be varied within the scope of the claims presented below. The foil patterns can be arranged, in the manner of the sensor foil patterning presented above, from a web-like material so that there are a number of them side by side, in which case this type of construction can be disposed in the whole floor area of the room or other space. Thus one embodiment as seen in FIG. 4, is to arrange the electrode patterns crosswise such that it comprises longitudinal foil webs 201, which can be connected via the connection leads 211 and a sensor connection to a sensor control apparatus SC101, and transverse foil sensor webs 202, which are insulated from the longitudinal foil webs and can be connected via the connection leads 212 and the electrical heating connection (113) to an electrical heating control apparatus (HC111). The floor heating can also be arranged so that it comprises two crossed heating foils, which are used for both heating and detecting. Additionally, the shape of the conductive areas can vary, and it is possible to arrange patterning of different shape in different foil layers. Additionally, it is conceivable that the heating starts when the floor is stepped on.

The invention claimed is:
1. A planar electrode system, comprising:
at least two foil-type, planar electrodes (101, 111) each having electrically conductive areas arranged sequentially and formed onto a substrate (105),
a first connection (103) for connecting one of the at least two planar electrodes (101) to an external sensor control apparatus (SC101),
a second connection (113) for connecting another one of the at least two planar electrodes (111) to an external electric heating control apparatus (HC111),
wherein the foil-type, planar electrodes (101, 111) have a same foil construction,
the foil-type planar electrode construction is adapted to operate both as a planar sensor, in which case the foil-type, electrically conductive, planar electrode (101) is connected via a connection (103) for a sensor to the external sensor control apparatus (SC101), and as an electrical floor heating element, in which case the foil-type, electrically conductive, planar electrode (111) is connected via a connection (113) for electrical heating to the external electrical heating control apparatus (HC111), and
wherein the foil-type, planar electrode construction comprises the at least two foil-type, planar electrodes (101, 111) being superimposed on each other, an insulating protective layer (104) above the upper foil-type planar electrode, and another insulating protective layer (104) between the superimposed foil-type, planar electrodes, and the construction is adapted to operate such that one of at least two foil-type, planar electrodes is adapted to operate as the planar sensor, and the another one of the at least two foil-type, planar electrodes is adapted to operate as the electrical floor heating element.

2. A method for manufacturing a foil-type, planar electrode construction for floor heating having at least two foil-type, electrically conductive, planar electrodes (101,111), with electrically conductive areas arranged sequentially and formed onto a substrate (105), the method comprising:

connecting one of the at least two planar electrodes (101) to an external sensor control apparatus (SC101) using a first connection (103), connecting another one of the at least two planar electrodes (111) to an external electric heating control apparatus (HC111) using a second connection (113), arranging the two foil-type, planar electrodes (101, 111) so as to have a same foil construction, enabling the foil-type, planar electrode construction to operate both as a planar sensor, by connecting the foil-type, electrically conductive, planar electrodes (101) via the connection (103) to the sensor control apparatus (SC101), and as an electrical floor heating element, by connecting the foil-type, electrically conductive, planar electrodes (111) via the connection (113) for electrical heating to the electrical heating control apparatus (HC111), and superimposing the at least two foil-type, planar electrodes (101, 111), and an insulating protective layer (104) above the upper foil-type planar electrode, and placing another insulating protective layer (104) between the at least two superimposed foil-type, planar electrodes (101,111), thereby enabling the construction to operate such that one of the foil-type, planar electrodes (101) is adapted to operate as a planar sensor, and enabling the another one of the foil-type, planar electrodes (111) to operate as the electrical floor heating element.

3. The system according to claim 1, wherein each of the foil-type, electrically conductive, planar electrodes (101, 111) comprises a number of the electrically conductive areas that are juxtaposed, and which are connected with connection leads to the corresponding external control apparatus (SC101, HC111).

4. The system according to claim 1, wherein each of the foil-type, electrically conductive, planar electrodes (101, 111) comprises at least two electrically conductive, electrode areas that are superimposed, and which are connected with connection leads to the corresponding external control apparatus (SC101, HC111).

5. The system according to claim 1, wherein electrically conductive electrode areas of each of the planar electrodes (101, 111) are connected with connection leads, of which at least a part are formed in the construction and which are connected with the corresponding connectors (103, 113) to other connection leads on an edge of the construction.

6. The system according to claim 1, wherein the planar sensor and the electric floor heating element are adapted to operate simultaneously.

7. The system according to claim 6, further comprising:
a filter (F101), with which interfering signals are filtered, is connected to the external sensor control apparatus (SC101) of the planar sensor.

8. The system according to claim 1, wherein control by the sensor control apparatus (SC101) and the electrical heating control apparatus (HC101) occurs alternately at set intervals by alternately controlling by means of a switch to alternate the sensor control apparatus (SC101) and the electrical heating control apparatus (HC101) intermittently so that they connect in turn to a same one of the two planar electrodes at set intervals.

9. The system according to claim 8, wherein the electrical floor heating element and the planar sensor are in a same foil/pattern, and the planar sensor is adapted to operate sequentially from one foil web to a next foil web, in which case the electrical floor heating element is switched off from the one foil web at a time for 0.1-1 sec when measuring with the planar sensor for detection.

10. The system according to claim 1, wherein a shape of electrically conductive electrode areas is arranged to be of different shapes in different layers of the system.

11. The system according to claim 1, wherein the electrical floor heating element is adapted to start when a floor is stepped on.

12. The system according to claim 1, wherein the foil-type, planar electrodes are arranged crosswise with respect to each other, and include first parallel webs (201), which are connected via first web connection leads (211) and a sensor connection to the external sensor control apparatus (SC101), and second parallel webs (202) extending perpendicular to the first parallel webs (201), wherein the second parallel webs (202), which are insulated from the first parallel webs (201), are connected via second web connection leads (212) and the connection (113) to an electrical heating control apparatus (HC111).

13. The system according to claim 1, wherein the electrical floor heating element is arranged as part of a floor, and the electrical floor heating element comprises crosswise heating foils, which are used for both heating and detecting.

14. The method according to claim 2, wherein the electrical floor heating element and the planar sensor are arranged on a same one of the protective layers.

15. The method according to claim 2, further comprising:
manufacturing a foil of the at least two foil-type, electrically conductive, planar electrode (101, 111) as a web by laminating a metal foil to a release web,
stamping out electrically conductive electrode areas and foil-type connection leads from the metal foil,
laminating a protective film onto electrically conductive electrode areas and the foil-type connection leads,
removing the release web, and
laminating a backing film to replace a release film.

16. The method according to claim 15, wherein the web is a sensor web comprising two or more superimposed layers.

17. The method according to claim 2, further comprising:
forming electrically conductive electrode areas on the substrate as printed layers, laminated layers, etched layers, or as films.

* * * * *